(12) United States Patent
Mukundan et al.

(10) Patent No.: US 12,133,362 B2
(45) Date of Patent: Oct. 29, 2024

(54) COOLING ELEMENT ARCHITECTURE FOR MEMS-BASED COOLING SYSTEM ARCHITECTURE

(71) Applicant: Frore Systems Inc., San Jose, CA (US)

(72) Inventors: Vikram Mukundan, San Ramon, CA (US); Ananth Saran Yalamarthy, Stanford, CA (US); Suryaprakash Ganti, Los Altos, CA (US); Seshagiri Rao Madhavapeddy, La Jolla, CA (US); Prabhu Sathyamurthy, San Jose, CA (US)

(73) Assignee: Frore Systems Inc., San Jose, CA (US)

( * ) Notice: Subject to any disclaimer, the term of this patent is extended or adjusted under 35 U.S.C. 154(b) by 281 days.

(21) Appl. No.: 17/862,171

(22) Filed: Jul. 11, 2022

(65) Prior Publication Data

US 2023/0011084 A1    Jan. 12, 2023

Related U.S. Application Data

(60) Provisional application No. 63/220,862, filed on Jul. 12, 2021.

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01)

(58) Field of Classification Search
CPC .............................. H05K 7/20272; G06F 1/20
USPC ........................................................ 165/80.4
See application file for complete search history.

(56) References Cited

U.S. PATENT DOCUMENTS

| | | | |
|---|---|---|---|
| 4,595,338 A * | 6/1986 | Kolm | F04D 33/00 310/330 |
| 7,282,837 B2 | 10/2007 | Scher | |
| 7,550,901 B2 * | 6/2009 | Chrysler | F04D 33/00 417/322 |
| 8,520,383 B2 * | 8/2013 | Park | F28F 13/02 361/679.48 |
| 8,963,402 B2 | 2/2015 | Kusano | |
| 10,438,868 B2 | 10/2019 | Liao | |
| 10,580,605 B2 * | 3/2020 | Tabib-Azar | H10N 30/306 |
| 11,503,742 B2 * | 11/2022 | Mukundan | H05K 7/20172 |
| 2004/0036380 A1 * | 2/2004 | Oda | H03H 9/19 310/311 |
| 2004/0174092 A1 * | 9/2004 | Iwata | H03H 3/04 310/324 |
| 2005/0089415 A1 | 4/2005 | Cho | |
| 2005/0225213 A1 | 10/2005 | Richards | |
| 2008/0304979 A1 | 12/2008 | Lucas | |
| 2011/0063800 A1 | 3/2011 | Park | |

(Continued)

*Primary Examiner* — Jon T. Schermerhorn, Jr.
(74) *Attorney, Agent, or Firm* — Van Pelt, Yi & James LLP

(57) ABSTRACT

A cooling system including a support structure and a cooling element is described. The cooling element has a thickness and includes an anchored region and a cantilevered arm. The anchored region is coupled to and supported by the support structure. The cantilevered arm extends outward from the anchored region. The cantilevered arm includes at least one cavity therein. The at least one cavity has a depth of at least one-third and not more than three-fourths of the thickness of the cooling element. The cooling element is configured to undergo vibrational motion when actuated to drive a fluid for cooling a heat-generating structure.

20 Claims, 14 Drawing Sheets

(56) References Cited

U.S. PATENT DOCUMENTS

| | | |
|---|---|---|
| 2011/0193643 A1 | 8/2011 | Tange |
| 2019/0101938 A1 | 4/2019 | Mou |
| 2021/0176895 A1 | 6/2021 | Mukundan |
| 2024/0136252 A1* | 4/2024 | Ganti ................. H05K 7/20281 |

* cited by examiner

COOLING ELEMENT ARCHITECTURE FOR MEMS-BASED COOLING SYSTEM ARCHITECTURE

CROSS REFERENCE TO OTHER APPLICATIONS

This application claims priority to U.S. Provisional Patent Application No. 63/220,862 entitled PIEZOELECTRIC ACTIVE MEMS COOLING SYSTEMS INCLUDING ENGINEERED ACTUATORS, TAILORED ORIFICES, CONTROLLED GAPS, AND STRIP LEVEL MANUFACTURING filed Jul. 12, 2021, which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
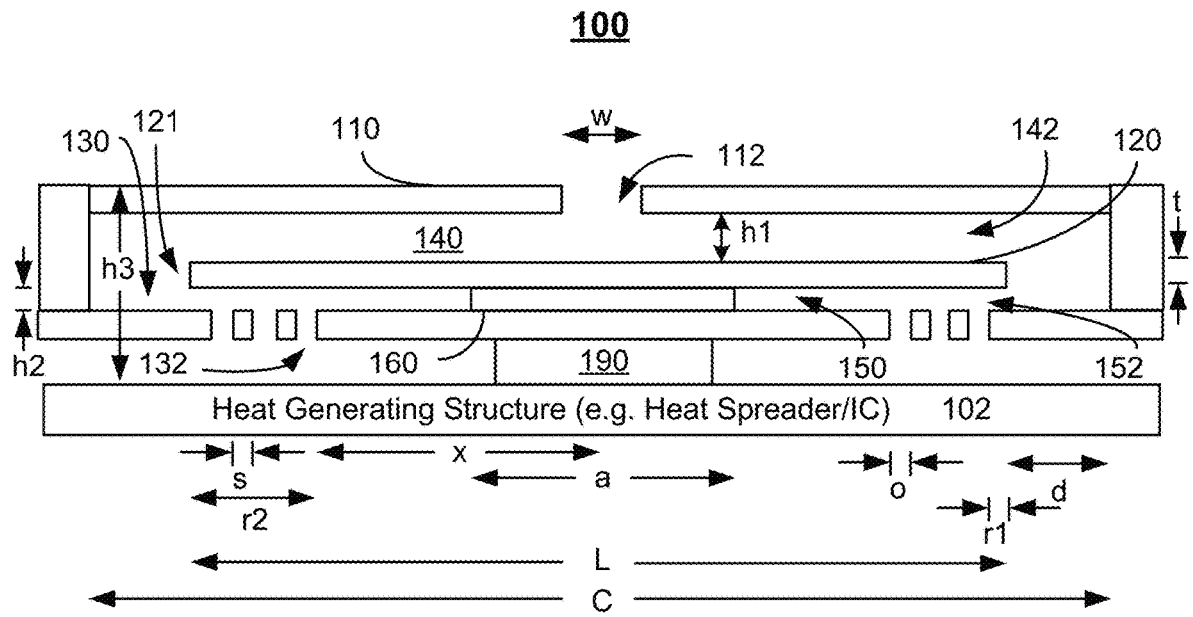
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling systems. Active cooling systems are those in which an electrical signal is used to drive cooling. An electric fan that has rotating blades is an example of an active cooling system, while a heat sink is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components, because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Consequently, active cooling systems face particular challenges when used in computing devices such as active computing devices. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions are desired.

A cooling system including a support structure and a cooling element is described. The cooling element has a thickness and includes an anchored region and a cantilevered arm. The anchored region is coupled to and supported by the support structure. The cantilevered arm extends outward from the anchored region. The cantilevered arm includes at least one cavity therein. The cavity/cavities have a depth of at least one-third and not more than three-fourths of the thickness of the cooling element. In some embodiments, the depth is at least one-half and not more than two-thirds of the thickness. The cooling element is configured to undergo vibrational motion when actuated to drive a fluid for cooling a heat-generating structure.

In some embodiments, the cantilevered arm includes a tip distal from the anchored region. The cavity/cavities include a first cavity on a bottom side of the cooling element and a second cavity on a top side of the cooling element. The first cavity is a distance from the tip and has a first depth. The second cavity has a second depth. The first depth plus the second depth is equal to the depth. The second cavity may also include a recessed portion. In some embodiments, the cavity/cavities of the cooling element further include at least one of an additional tab, a cavity extension and a cross rib.

The cantilevered arm may include a tip distal from the anchored region. The cavity/cavities are configured such that an anticlastic curvature across the tip is within thirty percent of a maximum normalized deflection. In some such embodiments, the anticlastic curvature is within twenty percent of the maximum normalized deflection. The cantilevered arm may be configured such that at a maximum normalized deflection, a bend in the cantilevered arm is present in a region that is at least one-half and not more than two-thirds along the cantilevered arm from the anchored region. The cooling element may also include an additional cantilevered arm extending outward from the anchored region opposite to the cantilevered arm. The additional cantilevered arm includes at least one additional cavity therein. The additional cavity/cavities have an additional depth of at least one-third and not more than three-fourths of the thickness of the cooling element. In some embodiments, the piezoelectric has a width, a length, and a thickness. The width is at least forty percent and not more than fifty percent of the cooling element width, the length is at least forty percent and not more than fifty percent of the cooling element length. The thickness is at least fifty micrometers and not more than two hundred micrometers In some embodiments, the cooling system has a top plate, a bottom plate, and cell walls. The top plate has at least one vent therein. The bottom plate has orifices therein and is disposed between the cooling element and the heat-generating structure. The cell walls are configured such that a top chamber is formed between the top plate and the cooling element. A bottom chamber is formed between the bottom plate, and the cooling element. The top chamber is in fluid communication with the bottom chamber.

In some embodiments the cooling system includes a plurality of cooling cells. Each cell may include the support structure, cooling element and bottom plates described herein. A method of cooling a heat-generating structure is also described. In some embodiments, the method includes driving cooling element(s) in the systems described herein. In some such embodiments, the cooling element(s) are driven at or near resonance.

Figure 1B:
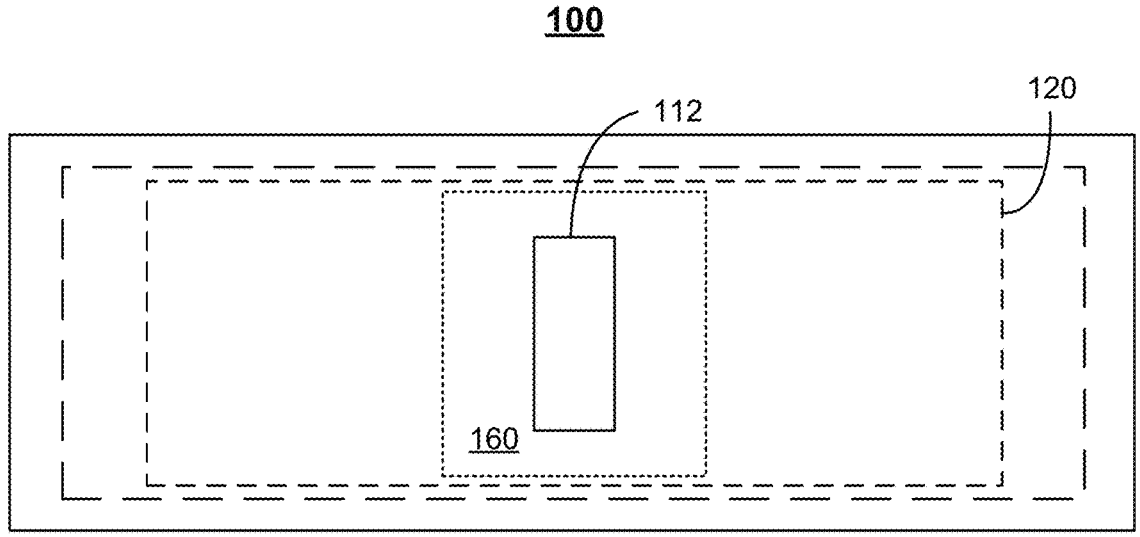
Figure 1C:
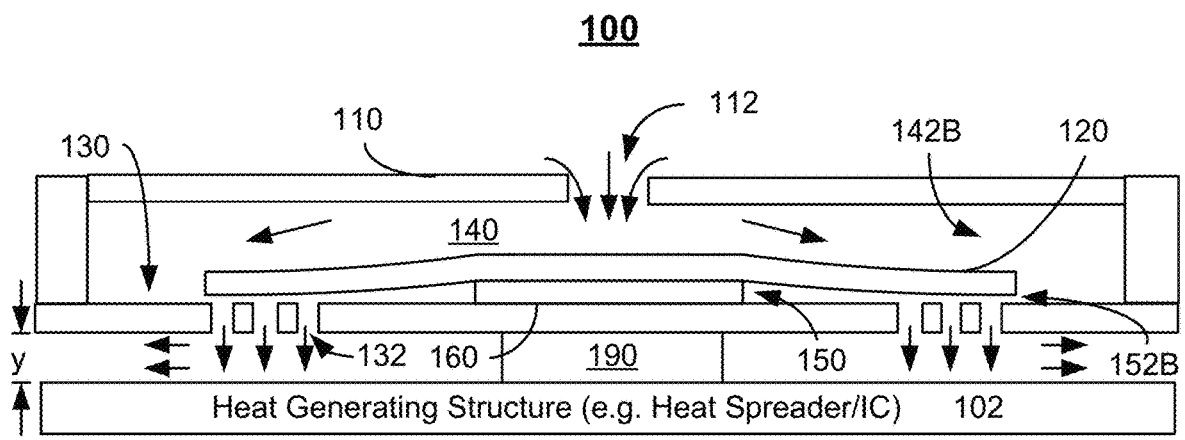
Figure 1D:
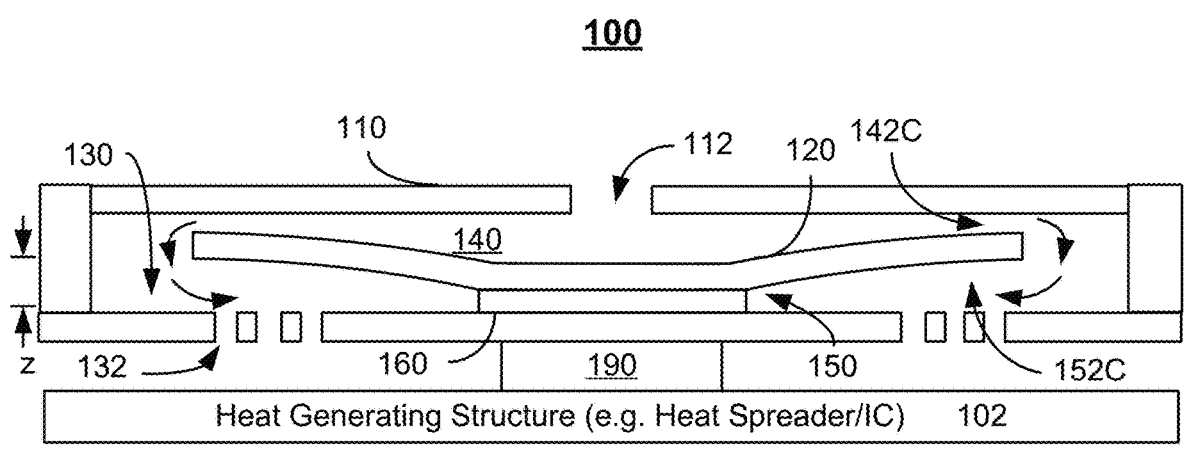
Figure 1E:
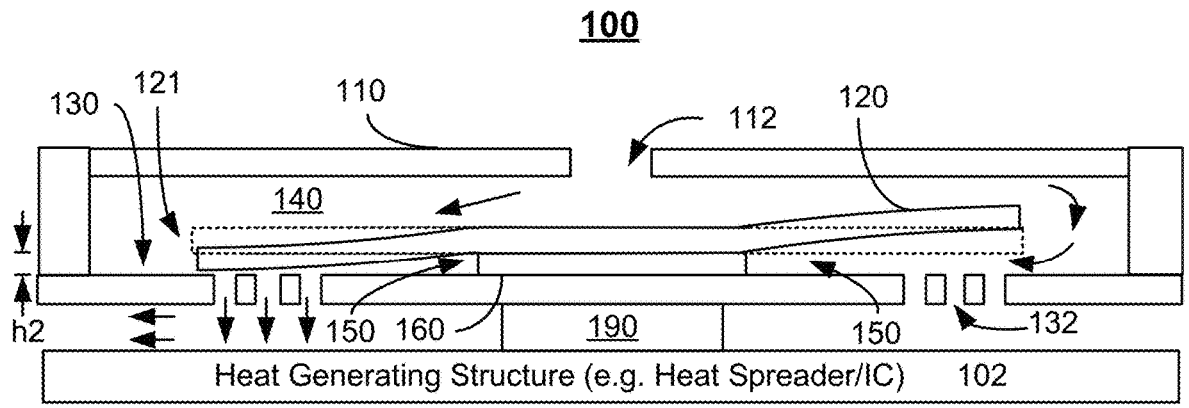
Figure 1F:
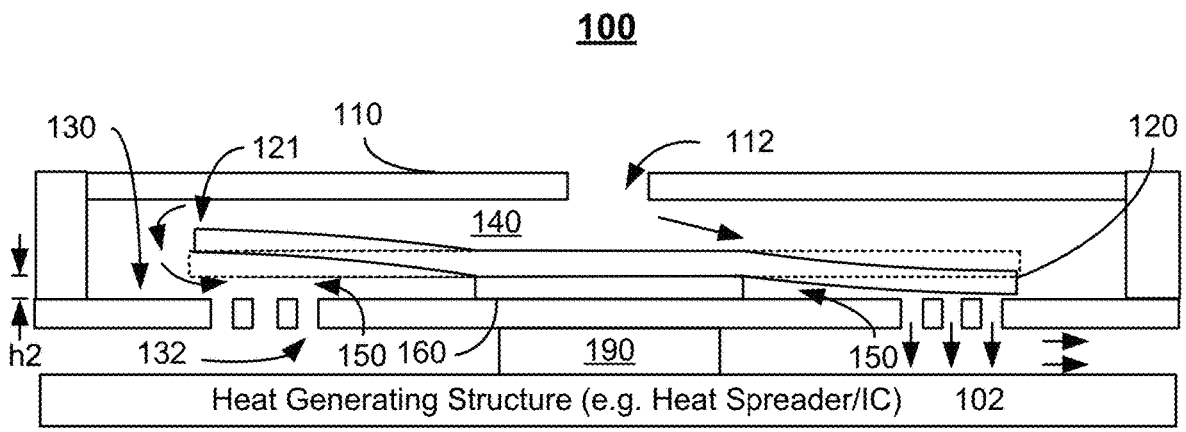
Figure 1G:
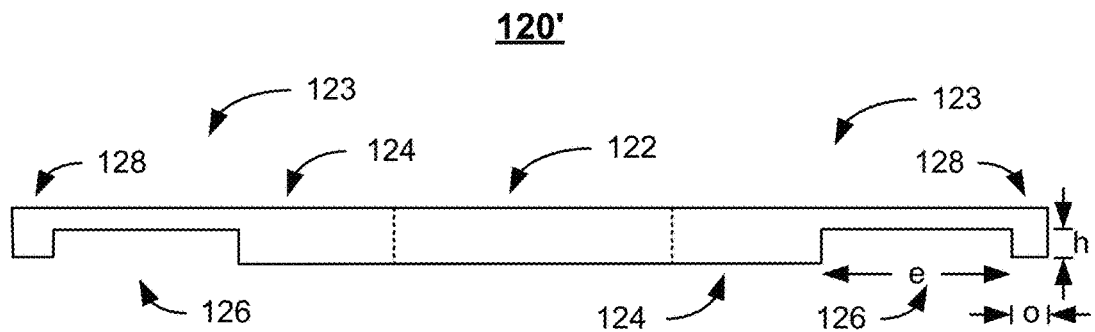

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, an additional jet channel plate may be present and supported by pedestal 190. Thus orifice plate 130 and/or such a jet channel plate may be part or all of a bottom plate supported by pedestal 190. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 3 millimeters. In some embodiments, the total height of cooling system 100 is less than 2.5 millimeters. In some embodiments, the total height of cooling system 100 may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, C/2=n$\lambda$/4, where $\lambda$ is the acoustic wavelength for the fluid and n is odd (e.g. n=1, 3, 5, etc.). For the lowest order mode, C=$\lambda$/2. Because the length of chamber 140 (e.g. C) is close to the length of cooling element 120, in some embodiments, it is also approximately true that L/2=n$\lambda$/4, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/ frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
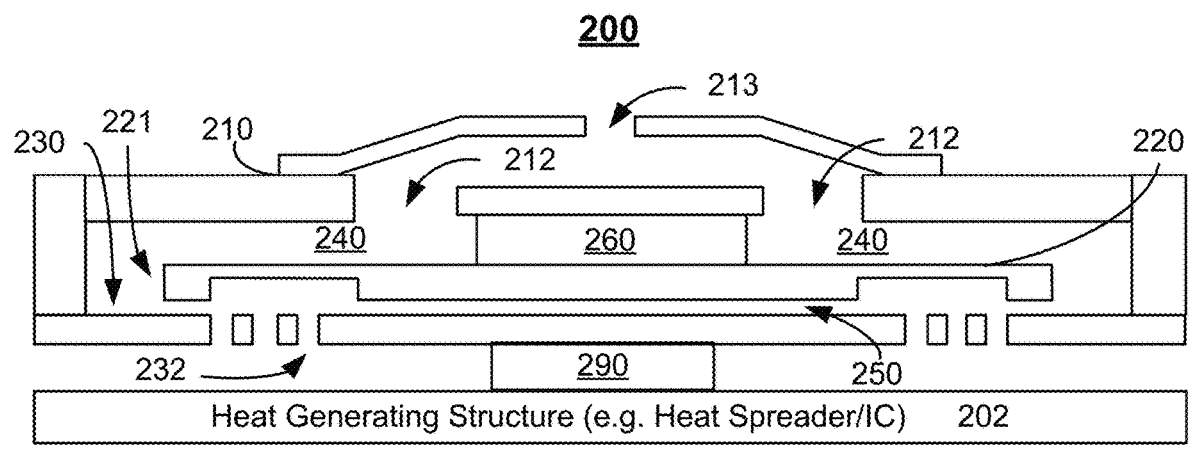
FIGS. 2A-2B depict an embodiment of an active MEMS cooling system including a centrally anchored cooling element.
Figure 2B:
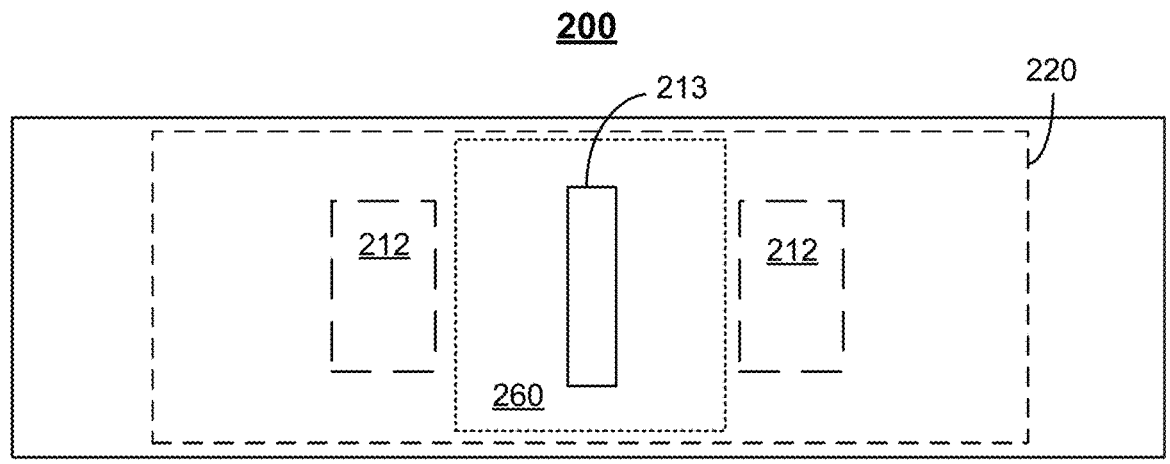

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
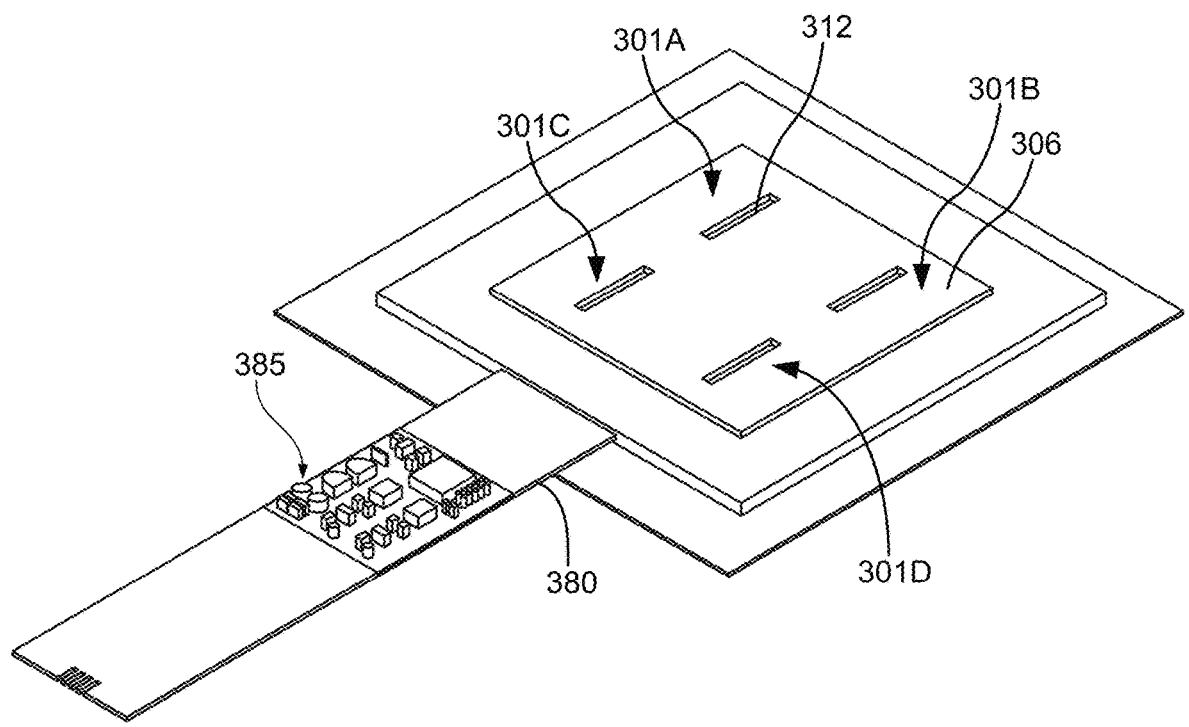
FIGS. 3A-3E depict an embodiment of an active MEMS cooling system formed in a tile.
Figure 3B:
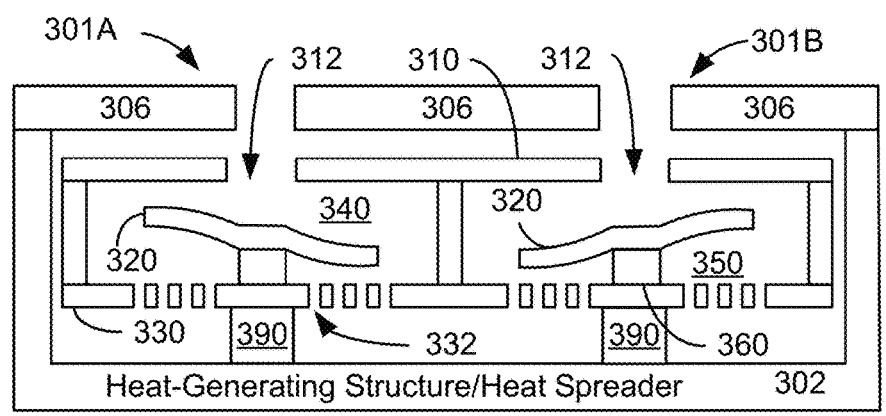
Figure 3C:
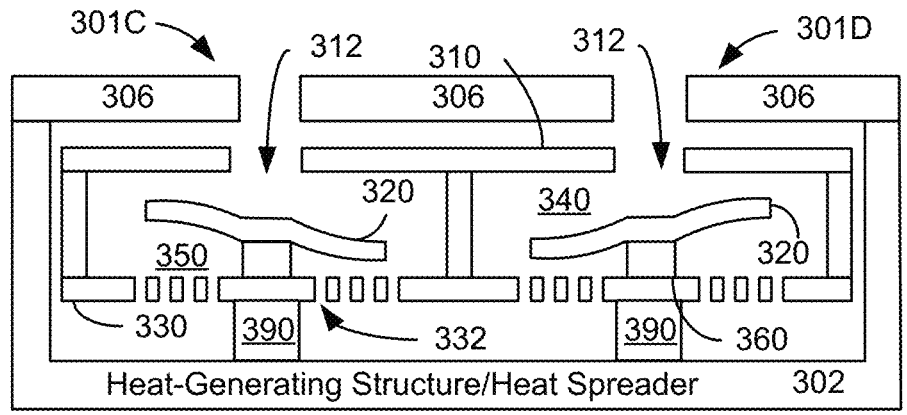
Figure 3D:
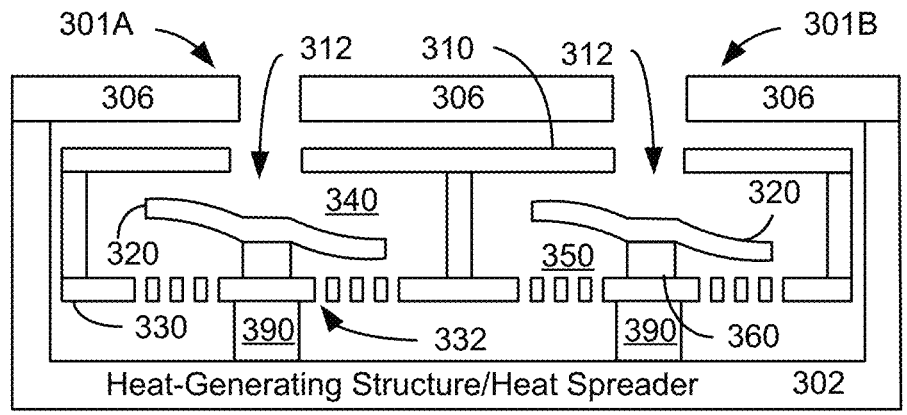
Figure 3E:
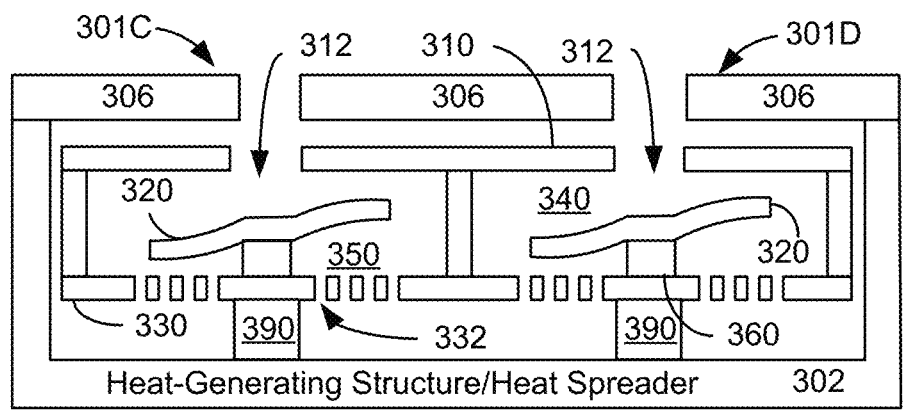

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4A:
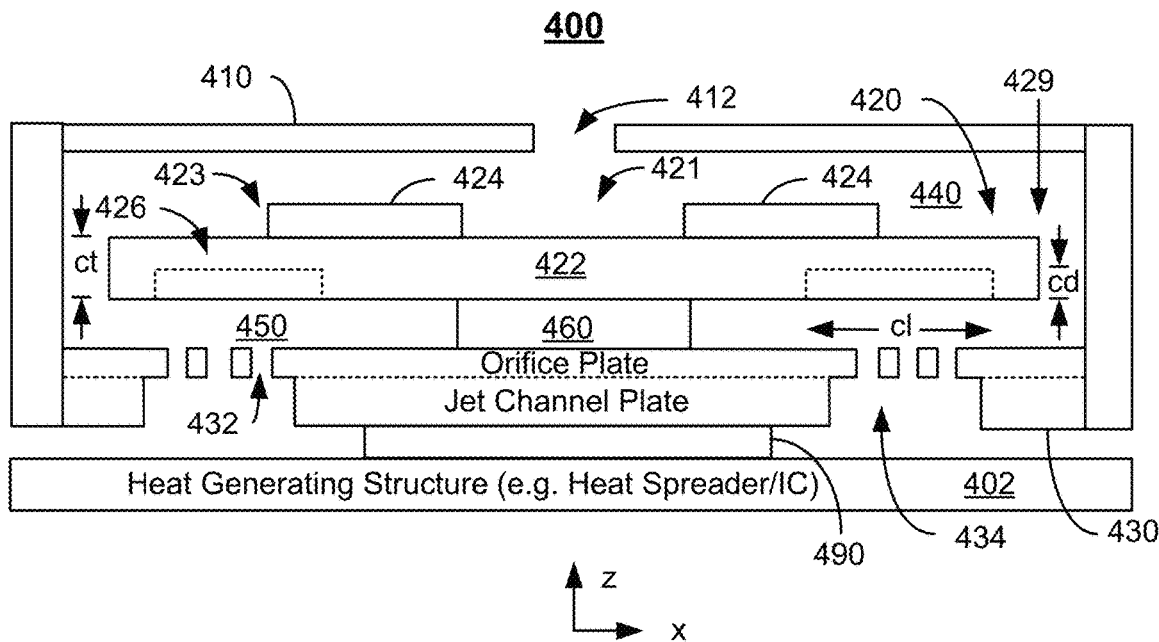
FIGS. 4A-4B depict an embodiment of an active MEMS cooling system including a centrally anchored, engineered cooling element.
Figure 4B:
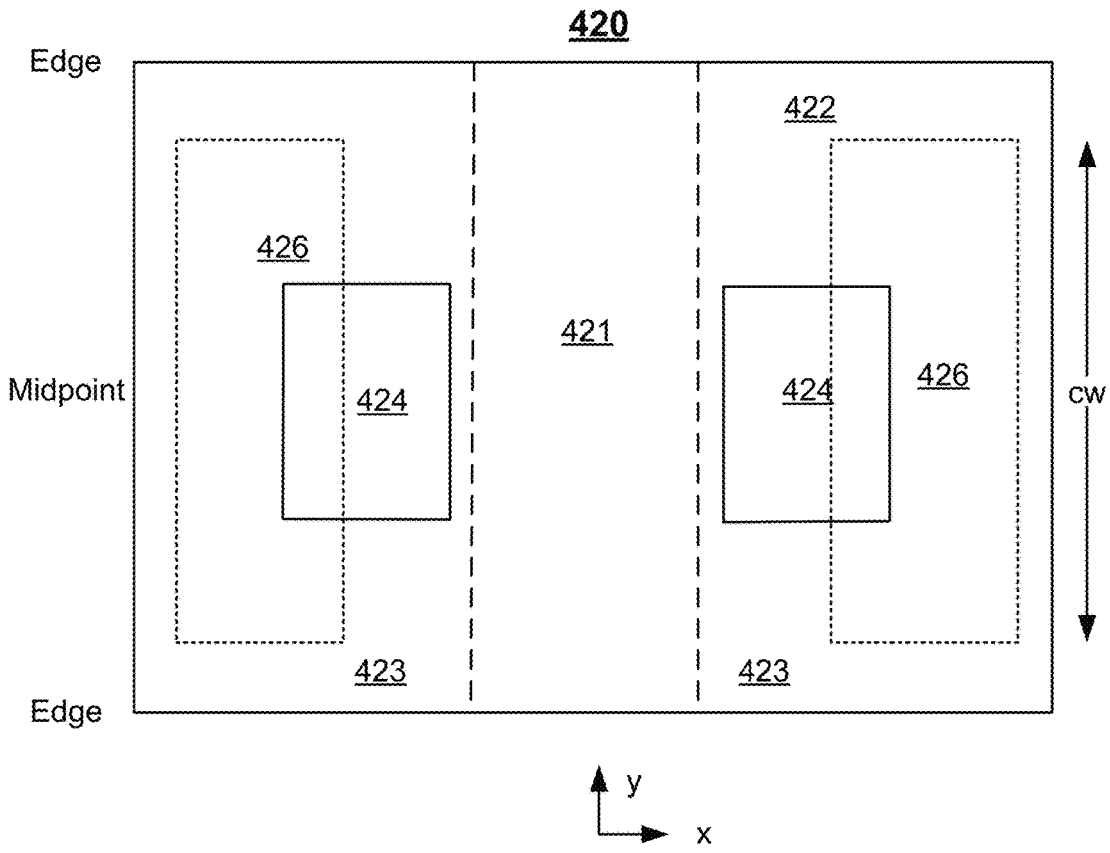

FIGS. 4A-4B depict an embodiment of active MEMS cooling system 400 including a centrally anchored, engineered cooling element 420. FIGS. 4A and 4B are not to scale and for clarity, only some structures are shown. Cooling system 400 may be a cooling cell that is part of a cooling system including multiple cells, such as tile 300. The device cooled by MEMS cooling system 400 may be a laptop computer, a tablet or notebook computer, a smart phone, and/or other mobile devices. The device may also be another device, such as a server in a rack, a game console, or a desktop computer. In some embodiments, therefore, the device is thin. For example, in some embodiments, the device in which cooling system 400 is integrated has a thickness (height along the smallest dimension, the z-direction in FIG. 4A) of not more than twenty-five millimeters. The thickness is not more than ten millimeters in some embodiments. In some such embodiments, the thickness of the device is not more than eight millimeters. However, other thicknesses are possible. Further, the total height of cooling system 400 (e.g. from the top of heat-generating structure 402 to the top of top plate 410) may be less than three millimeters.

Cooling system 400 includes top plate 410 having vent(s) 412 therein, cooling element 420 having cantilevered arms 423, bottom plate 430 having orifices 432 and cavities 434, top chamber 440, bottom chamber 450, anchor 460, and pedestal 490 that are analogous to top plate 110 having vent(s) 112 therein, cooling element 120', bottom plate (e.g. orifice plate) 130 having orifices 132, top chamber 140, bottom chamber 150, anchor 160, and pedestal 190, respectively. Cooling system 400 thus operates in a manner analogous to cooling system(s) 100, 200, and/or 300. Cooling element 420 is centrally supported by anchor 460 such that at least a portion of the perimeter of cooling element 420 is free to vibrate. In the embodiment depicted, anchor 460 extends along the axis of cooling element 420 (i.e. in the y-direction). In other embodiments, anchor 460 is only near the center portion of cooling element 420. Cantilevered arms 423 of cooling element 420 may be driven in-phase. In some embodiments, cantilevered arms 423 of cooling element 420 are driven out-of-phase.

Bottom plate 430 having orifices 432 therein is analogous to bottom plate 130 and orifices 132. In addition, bottom plate 430 includes cavities 434. Bottom plate 430 may thus be considered to include an orifice plate analogous to orifice plate 130 and an additional jet channel plate that has cavities 434. A possible separation between such an orifice plate and a jet channel plate is shown by dotted lines in FIG. 4A. Also shown is heat generating structure 402, which may be a structure such as an integrated circuit that may generate heat and is desired to be cooled and/or a heat spreader (e.g. analogous to heat spreader 102 and/or 302) that is thermally coupled to a structure that is desired to be cooled. Although depicted separately, pedestal 490 may be part of bottom plate 430 (e.g. may be part of the jet channel plate). In other embodiments, a bottom plate analogous to orifice plate 130 may be used.

Cooling element 420 is centrally anchored (i.e. attached) to anchor (i.e. support structure) 460. In some embodiments, cooling element 420 is wider (in the y-direction) than it is long (in the x-direction). For example, cooling element 420 may be nominally eight millimeters wide, anchored region 421 may be two millimeters long, and cantilevered arms 423 may each be three millimeters long in some embodiments. Although termed an "anchor," in some embodiments, anchor 460 may flex or rotate through small angles (e.g. less than one degree). Cooling element 420 includes an actuator 422 and piezoelectrics 424. Cooling element 420 may also be considered to be divided into an anchored region 421 and cantilevered arms 423. Piezoelectrics 424 are used to drive cooling element 420 to vibrate. In the embodiment shown, piezoelectrics 424 are on the upper surface (distal from bottom plate 430) of actuator 422. In some embodiments, piezoelectrics 424 may have another location and/or be integrated in another manner. Actuator 422 may be formed of materials having a high acoustic velocity (e.g. greater than four thousand meters per second) and low internal losses (e.g. not more than 0.1 percent structural losses). Examples of materials that may be used for actuator 422 include stainless steel such as SUS304 and/or SUS316, A17075, A16063, Ti64, Ti Grade 2, Ti Grade 9, Monel, aluminum bronze, and/or aluminum. In some embodiments, the actuator consists of one or more of the low internal loss materials. In some embodiments, actuator 422 includes or consists of one or more of SUS304, SUS316, A17075, A16063, Ti64, Ti Grade 2, and Ti Grade 9. The use of such low loss materials may improve the efficiency of cooling system 400.

Cantilevered arms 423 include step regions, extension regions and outer regions analogous to anchored region 122, step region 124, extension region 126 and outer region 128 of cooling element 120'. For example, actuator 422 includes cavities 426 that may be considered analogous to extension regions 126. In the embodiment shown, however, cavities 426 do not extend to the edges of actuator 422. Consequently, cavities 426 are indicated by dotted lines in FIGS. 4A-4B. In some embodiments, cavities 426 may extend to the edges of actuator 422.

Cooling element 420 is configured to improve performance of cooling system 400. For example, cavities 426, piezoelectrics 424, and other features of cooling element 420 are configured to improve the flow of fluid (e.g. air) driven through cooling system 400, while mitigating stress on cooling element 420. For example, the size (e.g. depth) and configuration of cavities 426 and/or the size and location of piezoelectrics 424 may improve the volumetric displacement of fluid for each stroke of cooling element 420, provide a lower stress on piezoelectrics 424, and mitigate power losses.

Each cantilevered arm 423 includes at least one cavity 426 therein. In the embodiment shown, cavities 426 are on only one side (e.g. the bottom/surface closest to bottom plate 430) of cooling element 420. In some embodiments, cavities 426 may be on both sides (e.g. the bottom/surface closest to bottom plate 430 and the top/surface closest to top plate 410) of cooling element 420. In some embodiments, cavities 426 may be only at the top (e.g. the surface closest to top plate 410) of cooling element 420. The presence of cavities 426 in the bottom of cooling element 420 mitigates the pressure against which cantilevered arms 423 work. Thus, cooling element 420 may improve the efficiency of cooling system 400 in a manner analogous to cooling element 120', discussed above. In addition, the depth (cd), length (cl), and width (cw) of cavities 426 may be configured to further improve efficiency. In some embodiments, cavities 426 have a depth (cd) of at least one-third and not more than three-fourths of the thickness (ct) of cooling element 420. In some embodiments, the depth is at least one-half and not more than two-thirds of the thickness. In some embodiments, cl is nominally one-half (e.g. at least forty percent and not more than sixty percent) of the length of cantilevered arm 423 in the x-direction. In some embodiments, cw is nominally ninety percent (e.g. at least eighty percent and not more than ninety-five percent) of the width of the cantilevered arm in the y-direction.

Figure 5A:
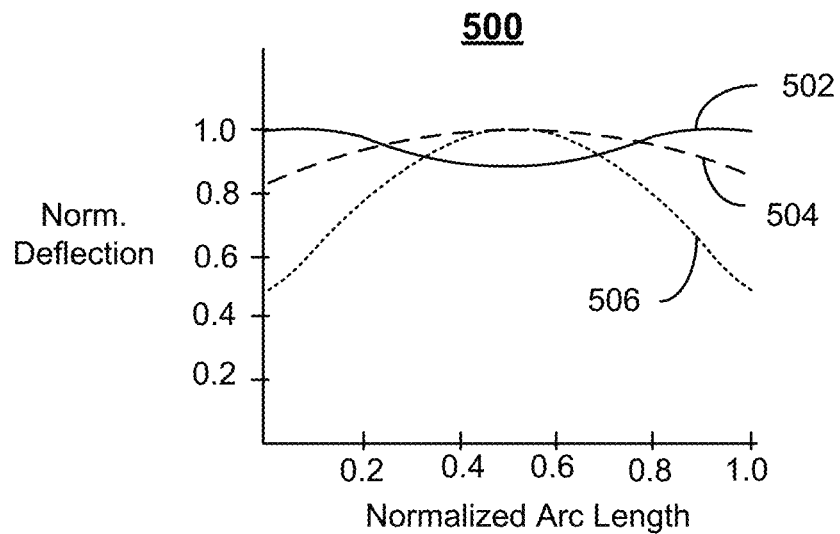
FIGS. 5A-5B are graphs depicting characteristics of embodiments of an active MEMS cooling system including a centrally anchored engineered cooling element.
Figure 5B:
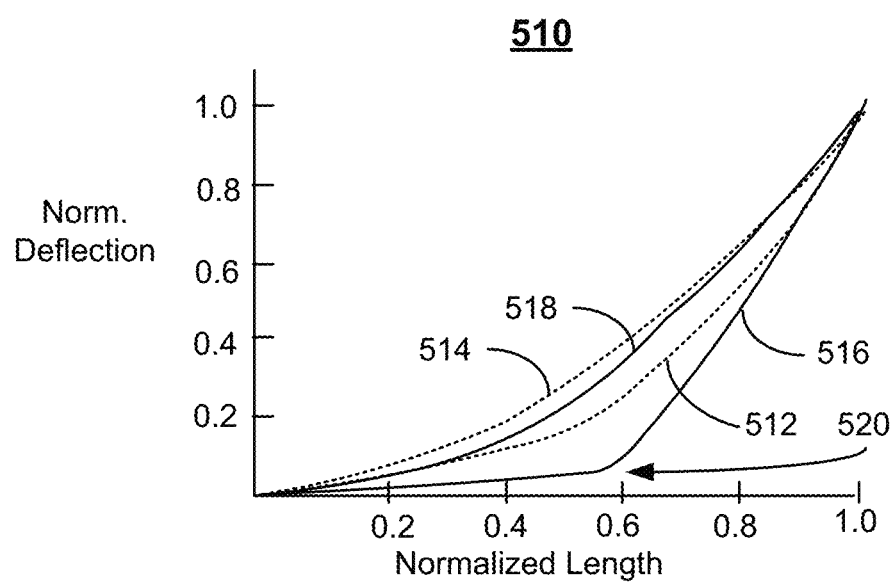

Some enhancements in performance based on engineering of cooling element 420 may be explained with respect to FIGS. 5A and 5B. FIGS. 5A and 5B are graphs 500 and 510, respectively, depicting characteristics of embodiments of an active MEMS cooling system, such as cooling system 400. Consequently, graphs 500 and 510 are discussed in the context of cooling system 400. However, graphs 500 and 510 are for explanatory purposes only and not intended to represent particular embodiments. FIG. 5A depicts the normalized deflection of tip 429 of cooling element 420 versus normalized arc length. Stated differently, graph 500 depicts the normalized maximum motion of tip 429 in the z-direction versus length along the y-direction of cooling element 420. Because cooling element 420 changes shape in multiple dimensions (e.g. in x and y), graph 500 may be viewed as the anticlastic curvature for cooling element 420 observed when the cantilevered arms 423 are operating under or near resonance. Curves 502, 504, and 506 are for cavities 426 of increasing depth. For lower cavity depths, curve 502 indicates that tip 429 of cooling element 420 remains the flatter, with the center and edges having a slightly smaller deflection than other portions of cooling element 420. For larger cavity depths, curve 504 indicates that the central region of cooling element 420 has the largest deflection, while edges deflect slightly less. For deeper cavities, curve 506 indicates that the edges of cooling element 420 deflect significantly less than the central region. The area under each curve 502, 504, and 506 indicates the volumetric deflection (i.e. the volume of fluid moved) by cooling element 420 for each cavity depth. Consequently, curve 502 corresponds to the largest volumetric deflection, curve 504 corresponds to the next highest volumetric deflection, and curve 506 corresponds to the lowest volumetric deflection. In order to maintain a higher fluid flow, curve 506 corresponding to the deepest cavity (absent other engineering) may be undesirable. Thus, in some embodiments, cooling element 420 and cavities 426 are configured such that the minimum anticlastic curvature is not less than seventy percent (i.e. is within thirty percent) of the maximum normalized deflection (e.g. the maximum in the anticlastic curvature). In some embodiments, cooling element 420 and cavities 426 are configured such that the minimum anticlastic curvature is not less than eighty percent (i.e. is within twenty percent) of the maximum normalized deflection (e.g. the maximum in the anticlastic curvature). In graph 500, this would correspond to curves 502 and 504. In some such embodiments, cooling element 420 and cavities 426 are configured such that the minimum anticlastic curvature is not less than ninety percent (i.e. within ten percent) of the maximum normalized deflection. In graph 500, this would correspond to curves 502 and 504.

To reduce the power lost to strain in piezoelectrics 424, the strain on piezoelectrics 424 is desired to be reduced. Graph 510 indicates a mechanism to mitigate strain in piezoelectrics using cooling element design. Graph 510 depicts the normalized deflection during or close to resonance (i.e. maximum displacement) along the x-direction from the edge of anchored region 421 (at 0) to tip 429 (at 1) of cantilevered arm 423. Dotted curves 512 and 514 indicate the deflection of a cantilevered arm 523 along the midpoint and edge, respectively, for a shallower cavity 426. The midpoint and edge of cantilevered arm 423 is indicated in FIG. 4B. Solid curves 516 and 518 indicate the deflection of a cantilevered arm 523 along the midpoint and edge, respectively, for a deeper cavity 426. As indicated by FIG. 5B, curve 512 indicates that the midpoint of cantilevered arm 423 undergoes a larger, smooth deflection for lower cavity depths. In contrast, deeper cavities have a sharper bend 520 in the curve 516 at the midpoint. Further, bend 520 occurs between one-half and two-thirds of the distance from anchored region 421 to tip 429. As a result, piezoelectrics 424 located closer to anchored region 421 than the position of bend 520 (e.g. one-half to two-thirds of the distance to the tip) may undergo less deflection for a deeper cavity. Such piezoelectrics 424 may, therefore, be subject to less strain. For example, the peak strain for such a piezoelectric 424 may be reduced. Consequently, cavities 426 having depths that provide bends in the curvature analogous to bend 520 may mitigate piezoelectric strain and reduce power lost to strain. Such cavities 426 may have a depth of at least one-third and not more than two-thirds of the thickness of actuator 422 (and thus cooling element 420). In some embodiments, such cavities 426 may have a depth of at least one-half of the thickness of actuator 422 (and thus cooling element 420). For example, in some embodiments, the depth of such a cavity 426 is not more than 200-215 micrometers for a cooling element 420 that is three hundred micrometers thick.

Thus, cooling elements configured such that the minimum anticlastic curvature is not less than eighty percent (or not less than ninety percent) of the maximum deflection in combination with having a bend in the normalized deflection of the actuator occurring at at least one-half and not more than two-thirds of the distance from anchored region 421 to tip 429 are desired. Such cooling elements may have improved efficiency, which may be considered to be flow divided by power input. The cooling elements may have improved efficiency because a larger volumetric displacement (and thus flow) is provided in conjunction with reduced strain. As indicated above, in some embodiments, cavities 426 may have a depth of at least one-third (or at least one-half) and not more than two-thirds of the thickness of cooling element 420 and may produce mitigation in strain in piezoelectrics. In some embodiments, however, such a depth of a cavity may not provide the desired volumetric displacement and/or anticlastic curvature. Consequently, cavities of the cooling element may be further engineered. In some embodiments, improved flow and/or improved anticlastic curvature (e.g. at or close to not less than eighty percent of the maximum deflection) may be achieved by further engineering the cavities.

FIGS. 6A-8 depict embodiments of cooling elements 620A, 620B, 720A, 720B, and 820, respectively, that are further engineered. FIGS. 6A-8 are not to scale and for clarity, only some structures are shown. Cooling elements 620A, 620B, 720A, 720B, and 820 are analogous to cooling element 420 and thus may be used in cooling systems such as cooling systems 100, 200, 300, and/or 400. Cooling elements 620A, 620B, 720A, 720B, and 820 each include anchored regions 621, 721, and 821 and cantilevered arms 623, 723, and 823 that are analogous to anchored region 421 and cantilevered arms 423, respectively. Cooling elements 620A, 620B, 720A, 720B, and 820 are each centrally supported at anchored regions 621, 721, and 821 such that at least a portion of the perimeter of cooling element 620A, 620B, 720A, 720B, and 820, respectively, is free to vibrate. In the embodiments depicted, anchors (not shown) and thus anchored regions 621, 721, and 821 extend along the axis of cooling elements 620A, 620B, 720A, 720B, and 820, respectively. In other embodiments, anchored regions 621, 721, and/or 821 may be only near the center portion of cooling elements 620A, 620B, 720A, 720B, and/or 820, respectively. Cantilevered arms 623, 723, and 823 of cooling elements 620A, 620B, 720A, 720B, and 820 may be driven in-phase or driven out-of-phase.

Figure 6A:
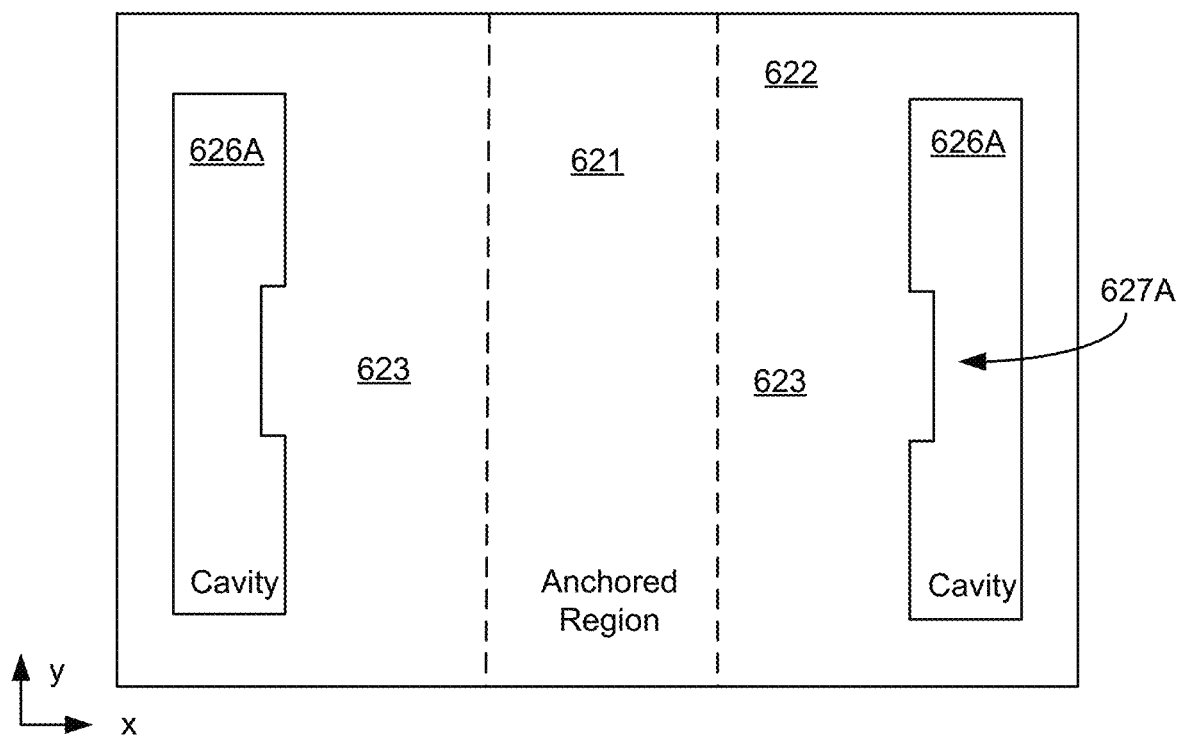
FIGS. 6A-6B depict embodiments of an engineered cooling element usable in an active MEMS cooling system.
Figure 6B:
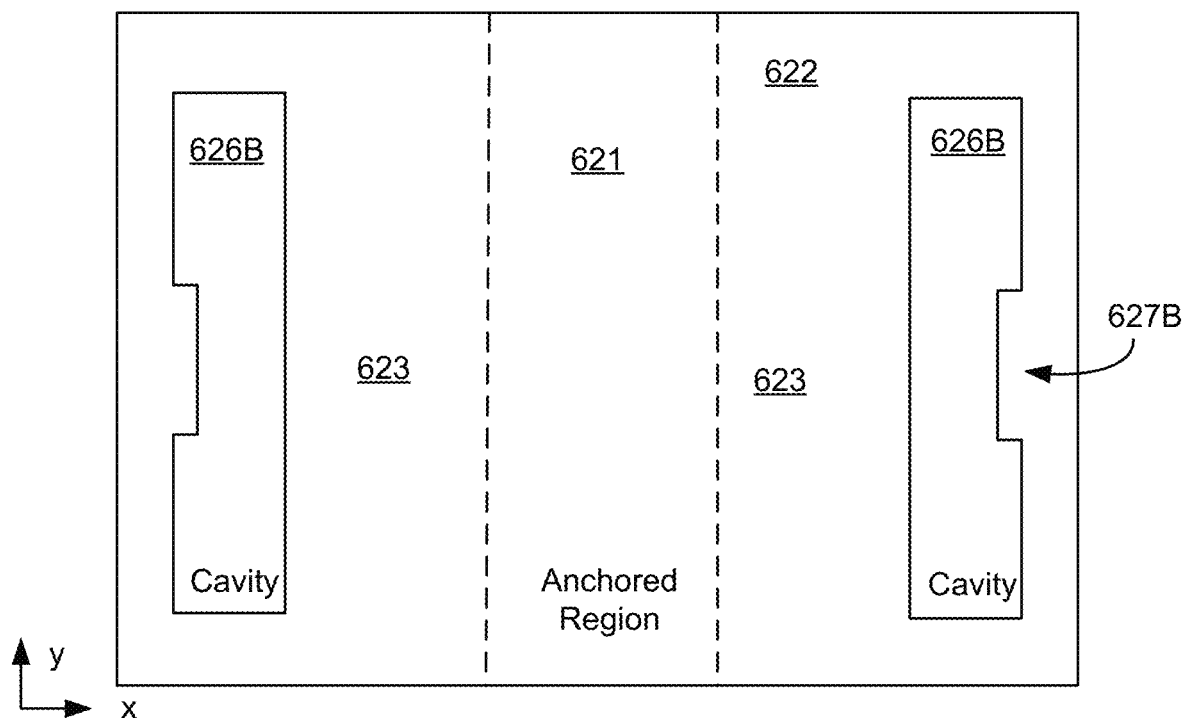

Referring to FIGS. 6A and 6B, cooling elements 620A and 620B each include cavities 626A and 626B, respectively. Cavities 626A and 626B are analogous to cavities 426. Thus, the cavity depth, cavity length, and/or cavity width of cavities 626A and/or 626B may be analogous to those of cavities 426. In addition, cavities 626A and 626B include tabs 627A and 627B, respectively. Thus, each cavity 626A and 626B has a slightly smaller volume than would be present without tabs 627A and 627B, respectively. Although one tab 627A and 627B is shown for each cavity 626A and 626B, respectively, multiple tabs may be used. Tabs 627A and/or 627B may have the same thickness(es) as the edges of cavities 626A and 626B, respectively, or different thickness(es). Tabs 627A and 627B are shown as rectangles but may have other shape(s). Further, although tabs 627A and 627B are shown as centrally located for cavities 626A and 626B, tabs may have other locations. In some embodiments, tabs 627A and 627B may have a width in the x-direction of at least one hundred micrometers and not more than five hundred micrometers. In some such embodiments, the width of tabs 627A and/or 627B in the x-direction is at least two hundred micrometers.

Figure 7A:
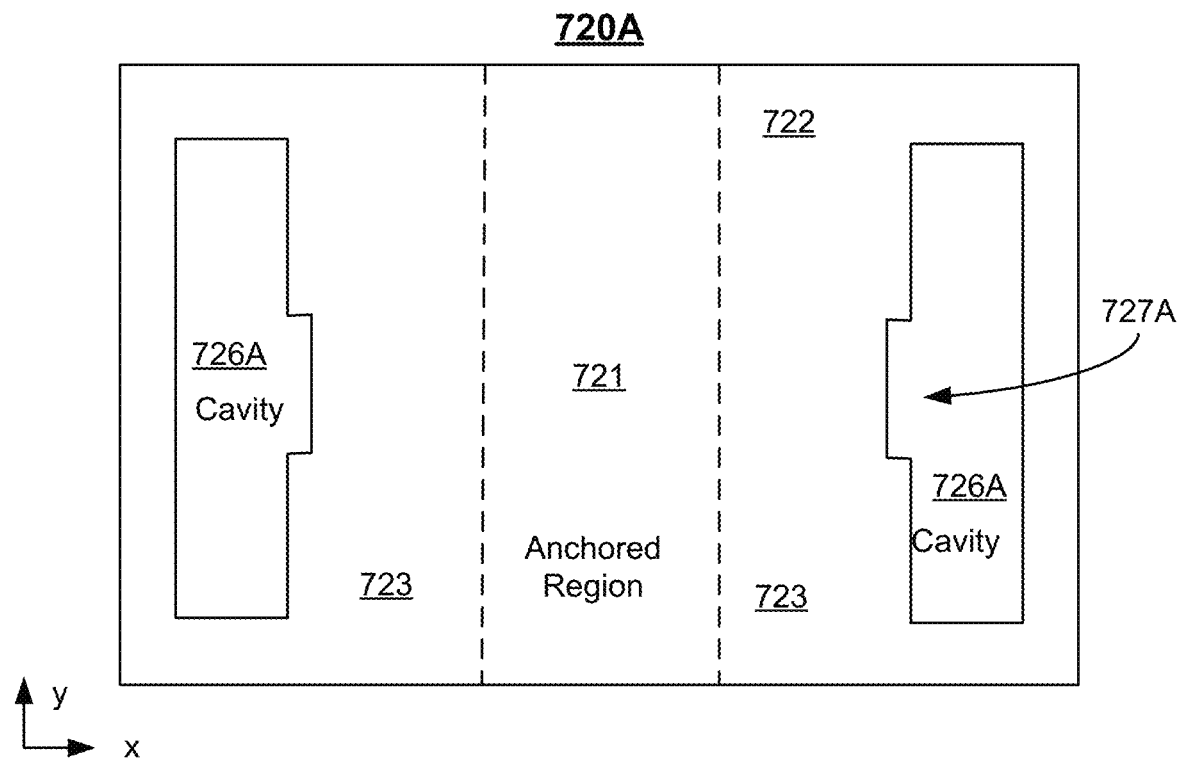
FIGS. 7A-7B depict embodiments of an engineered cooling element usable in an active MEMS cooling system.
Figure 7B:
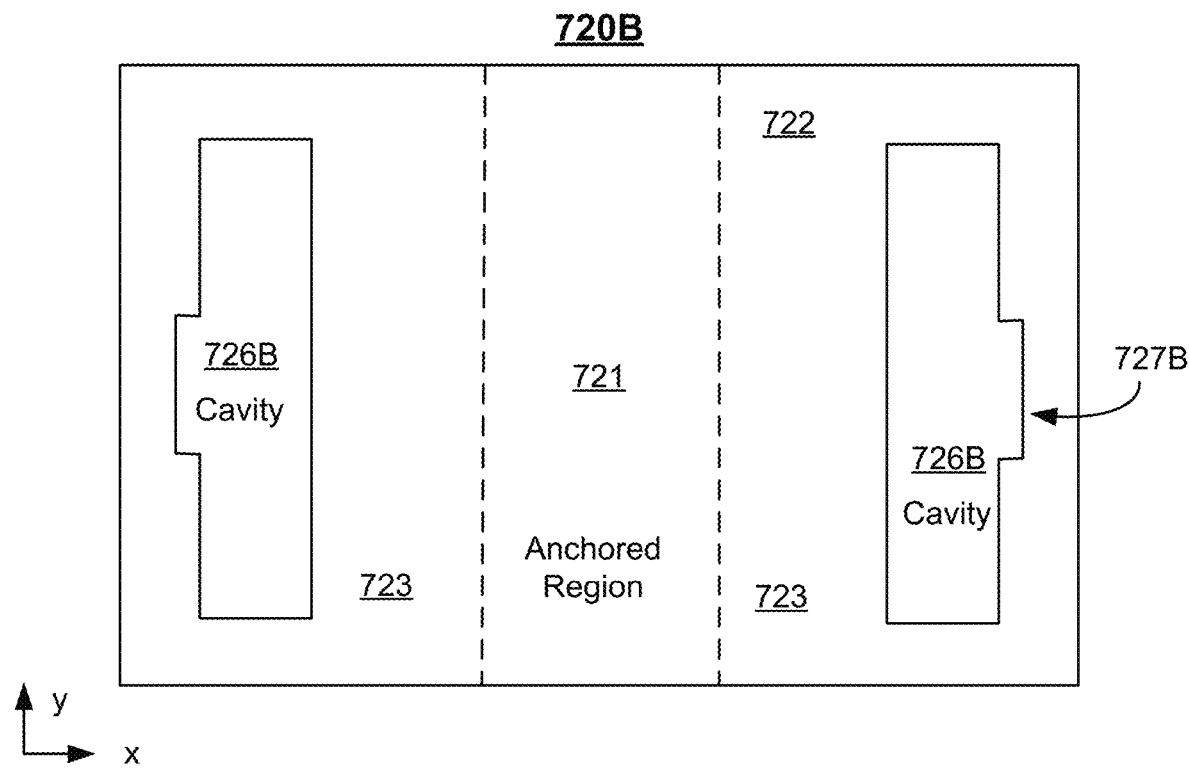

Similarly, FIGS. 7A and 7B depict cooling elements 720A and 720B that each includes cavities 726A and 726B, respectively. Cavities 726A and 726B are analogous to cavities 426. Thus, the cavity depth, cavity length, and/or cavity width of cavities 726A and/or 726B may be analogous to those of cavities 426. In addition, cavities 726A and 726B include extensions 727A and 727B, respectively. Thus, each cavity 726A and 726B has a slightly larger volume than would be present without extension 727A and 727B, respectively. Although one extension 727A and 727B is shown for each cavity 726A and 726B, respectively, multiple extensions may be used. Extensions 727A and/or 727B may have the same depths as cavities 726A and/or 726B, respectively, or different depth(s). Extensions 727A and 727B are shown as rectangles but may have other shape(s). Further, although extensions 727A and 727B are shown as centrally located for cavities 726A and 726B, extensions may have other locations. In some embodiments, extensions 727A and 727B may have a width in the x-direction of at least one hundred micrometers and not more than five hundred micrometers. In some such embodiments, extensions 727A and/or 727B have a width in the x-direction of at least two hundred micrometers.

Figure 8:
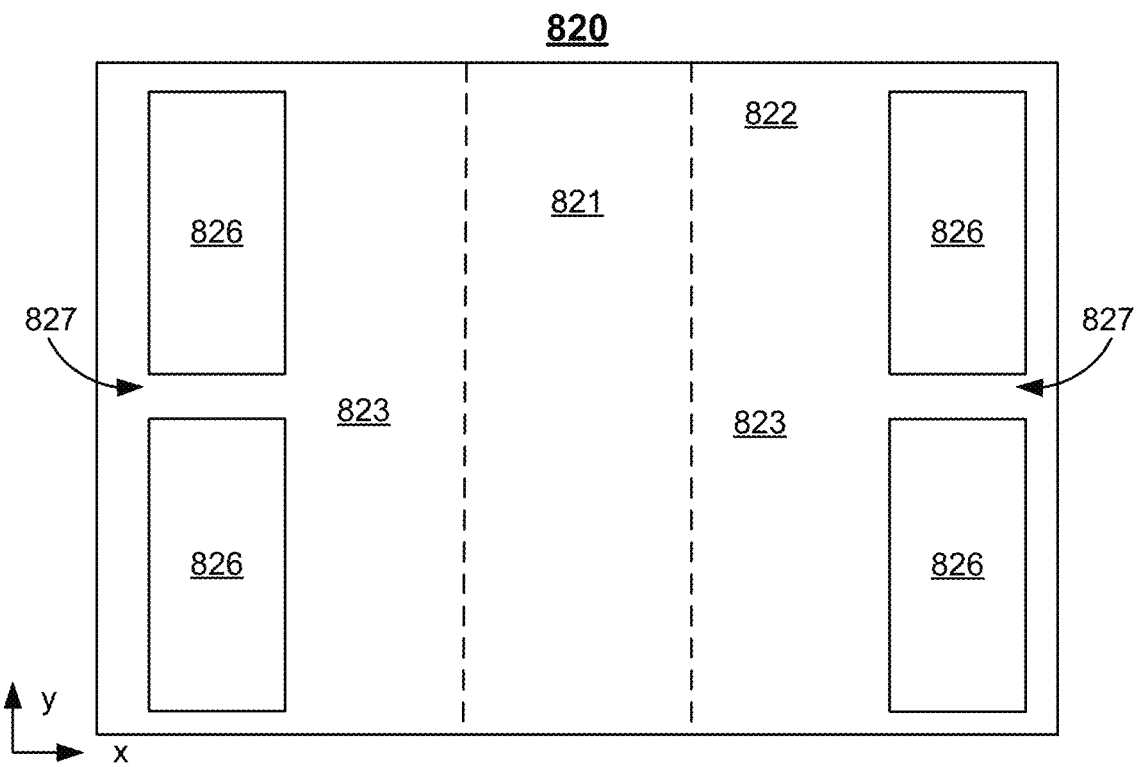
FIG. 8 depicts an embodiment of an engineered cooling element usable in an active MEMS cooling system.

FIG. 8 depicts cooling element 820 that includes cavities 826 and rib 827. Cavities 826 are analogous to cavities 426. Thus, the cavity depth and/or cavity length of cavities 826 may be analogous to those of cavities 426. However, because of the presence of rib 827, cavities 826 may have a lower width. In some embodiments, cavities 826 may be viewed as cavities 426 broken up by rib 827. Although one rib 827 is shown for each cantilevered arm 823, multiple ribs may be used. Further, although extensions ribs are shown as centrally located for cavities 826, ribs may have other locations.

Cooling elements 620A, 620B, 720A, 720B, and/or 820 may improve efficiency. In particular tabs 627A and 627B, extensions 727A and 727B and rib 827 may change the anticlastic curvature for cooling elements 620A, 620B, 720A, 720B, and/or 820 to be closer to that of curves 502 and/or 504. Thus, for the same depth, cooling elements 620A, 620B, 720A, 720B, and/or 820 may have a greater volumetric deflection. Thus, a higher flow may be achieved for the same cavity depth and, therefore, a reduced strain on the piezoelectrics. Consequently, efficiency of cooling elements 620A, 620B, 720A, 720B, and/or 820 may be improved.

Figure 9:
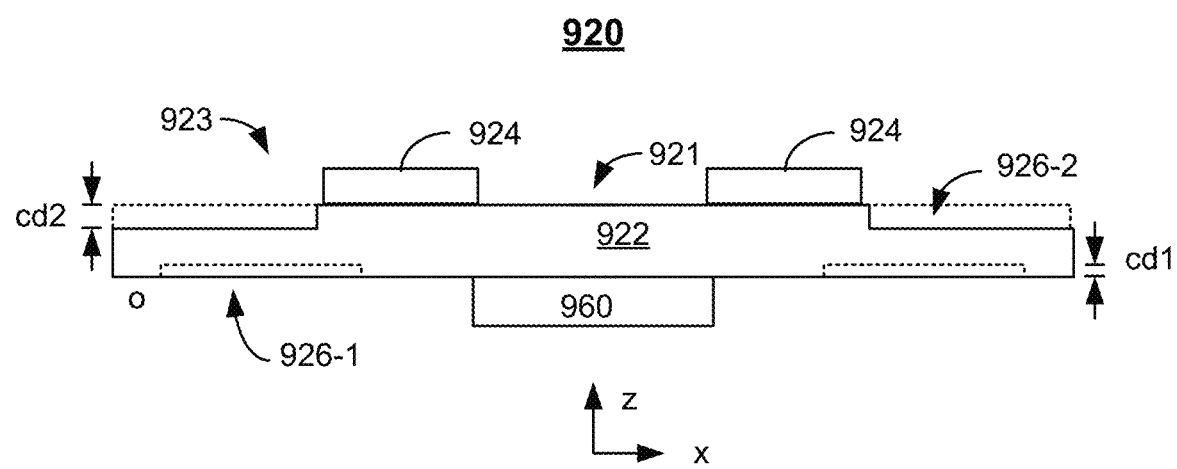
FIG. 9 depicts an embodiment of an engineered cooling element usable in an active MEMS cooling system.

FIG. 9 depicts an embodiment of cooling element 920 that is further engineered. FIG. 9 is not to scale and for clarity, only some structures are shown. Cooling element 920 is analogous to cooling element 420 and thus may be used in cooling systems such as cooling systems 100, 200, 300, and/or 400. Cooling element 920 includes anchored region 921 and cantilevered arms 923 that are analogous to anchored region 421 and cantilevered arms 423, respectively. Cooling element 920 is each centrally supported at anchored region 921 such that at least a portion of the perimeter of cooling element 920 is free to vibrate. In the embodiment depicted, anchor 960 and thus anchored region 921 extend along the axis of cooling element 920. In other embodiments, anchored region 921 may be only near the center portion of cooling element 920. Cantilevered arms 923 may be driven in-phase or driven out-of-phase.

Cooling element 920 includes cavities 926-1 and 926-2 on opposite sides of cooling element 920. In the embodiment shown, cavities 926-2 extend to the tip of actuator 922 and to the outer edges of cooling element 920. Cavities 926-1 do not extend to the tip and edges of actuator 922. Thus, the depth of cavities 926-1 and 926-2 are indicated by dotted lines. In some embodiments, cavities 926-2 may not extend to the tip and/or edge of actuator 922. Similarly, in some embodiments, cavities 926-1 do extend to the tip and/or edge of actuator 922. In some embodiments, the total depth of cavities 926-1 and 926-2 (i.e. cd1+cd2) is in the same range as the depth of cavities 426.

Figure 10A:
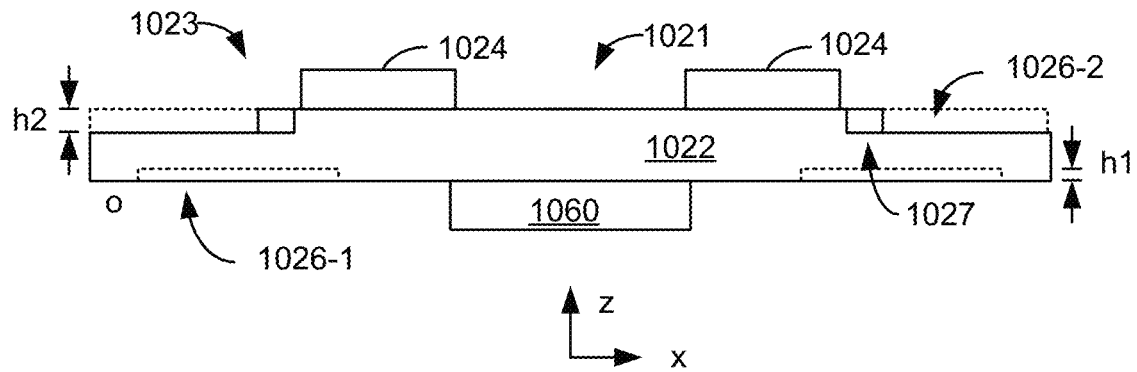
FIGS. 10A-10B depict an embodiment of an engineered cooling element usable in an active MEMS cooling system.
Figure 10B:
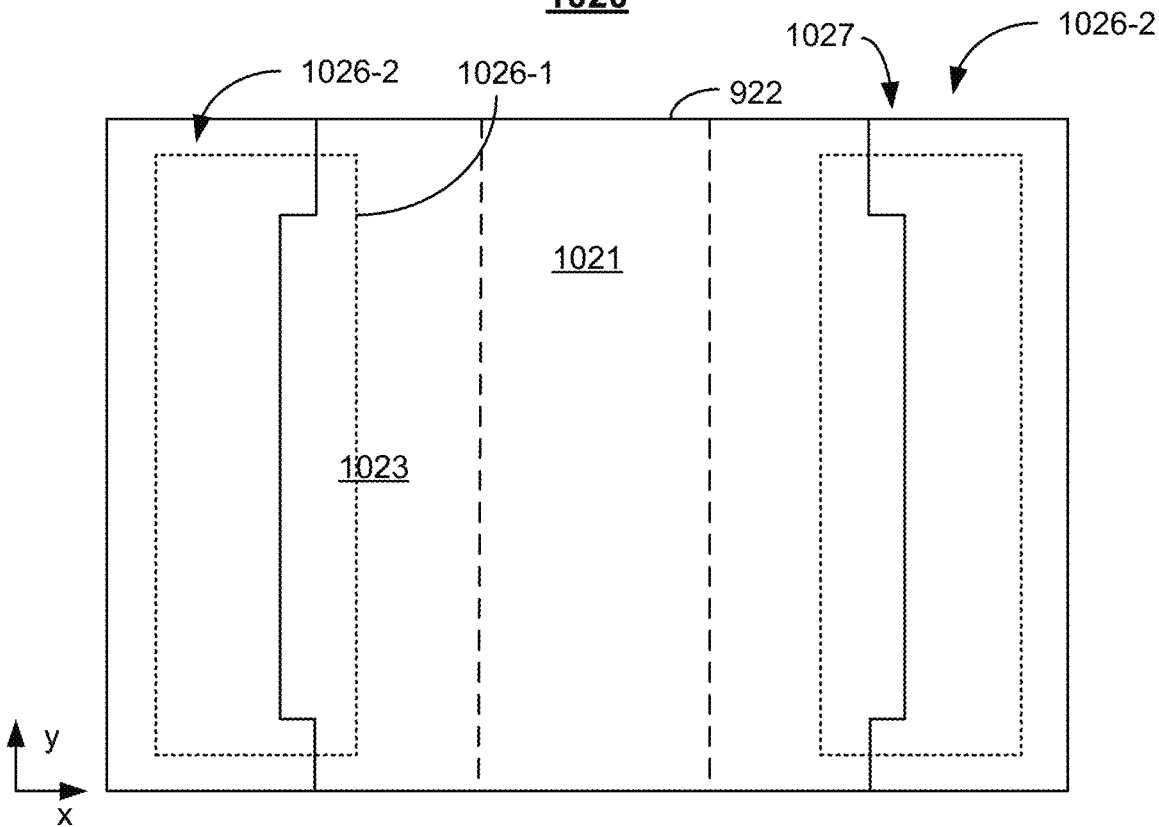

FIGS. 10 and 10B depict an embodiment of cooling element 1020 that is further engineered. FIGS. 10A and 10B are not to scale and for clarity, only some structures are shown. Cooling element 1020 is analogous to cooling elements 420 and 920 and thus may be used in cooling systems such as cooling systems 100, 200, 300, and/or 400. Cooling element 1020 includes anchored region 1021 and cantilevered arms 1023 that are analogous to anchored region 421 and cantilevered arms 423, respectively. Cooling element 1020 is each centrally supported at anchored region 1021 such that at least a portion of the perimeter of cooling element 1020 is free to vibrate. In the embodiment depicted, anchor 1060 and thus anchored region 1021 extend along the axis of cooling element 1020. In other embodiments, anchored region 1021 may be only near the center portion of cooling element 1020. Cantilevered arms 1023 may be driven in-phase or driven out-of-phase.

Cooling element 1020 includes cavities 1026-1 and 1026-2 on opposite sides of cooling element 1020 and are analogous to cavities 926-1 and 926-2 of cooling element 920. In the embodiment shown, cavities 1026-2 extend to the tip of actuator 1022 and to the outer edges of cooling element 1020. Cavities 1026-1 do not extend to the tip and edges of actuator 1022. Thus, the depth of cavities 1026-1 and 1026-2 are indicated by dotted lines. In some embodiments, cavities 1026-2 may not extend to the tip and/or edge of actuator 1022. Similarly, in some embodiments, cavities 1026-1 extend to the top and/or edge of actuator 1022. In some embodiments, the total depth of cavities 1026-1 and 1026-2 (i.e. h1+h2) is in the same range as the depth of cavities 426 (e.g. one half to two-thirds of the thickness of cooling element 1020). In addition, top cavities 1026-2 are shaped. Cavities 1026-2 include extensions 1027.

Cooling elements 920 and 1020 may improve performance. In particular cavities 926-2 and 1026-2 may be used to increase the frequency of cooling element 920 and 1020, respectively, by reducing the mass of cantilevered arms 923 and 1023. Thus, a larger static design may be achieved for the same frequency. In some embodiments, top cavities 926-2 and 1026-2 may be used to control the anticlastic curvature of cooling element 920 and 1020. For example, extensions 1027 may control the anticlastic behavior of cooling element 1020 to be closer to that of curves 502 and/or 504. Extensions 1027 may also be used to decrease the height (thickness) of the tip actuator 1022 to reduce the mass of actuator 1022 at its tip. Such contouring the tip of actuator 1022 may change the stiffness of actuator 1022. As such, the frequency and/or static deflection for a given voltage may be controlled. In some embodiments, the extensions 1027 are desired to be placed on cavities 1026-2 (e.g. as part of the top or actuator 1022) instead of cavities 1026-1 (e.g. as part of the bottom of the actuator 1022). Such a contour allows a change in the thickness of the actuator tip substantially without changing the pinch point (point at which flow through the orifices of a cooling system using cooling element 1020 is cut off by deflection of cooling element 1020). Further, cavities 926-2 and 1026-2 may be used to reduce the fluidic pressure of a top chamber (e.g. chamber 440) to reduce fluidic damping losses. Bottom cavities 926-1 and 1026-1 may be used to mitigate strain in piezoelectrics in a manner analogous to cavities 426. In addition, cooling elements 920 and 1020 may be fabricated using simultaneous etches from both the top and bottom. Time for fabrication may be reduced. Thus, manufacturing is facilitated. Consequently, performance and manufacturing may be improved.

Figure 11:
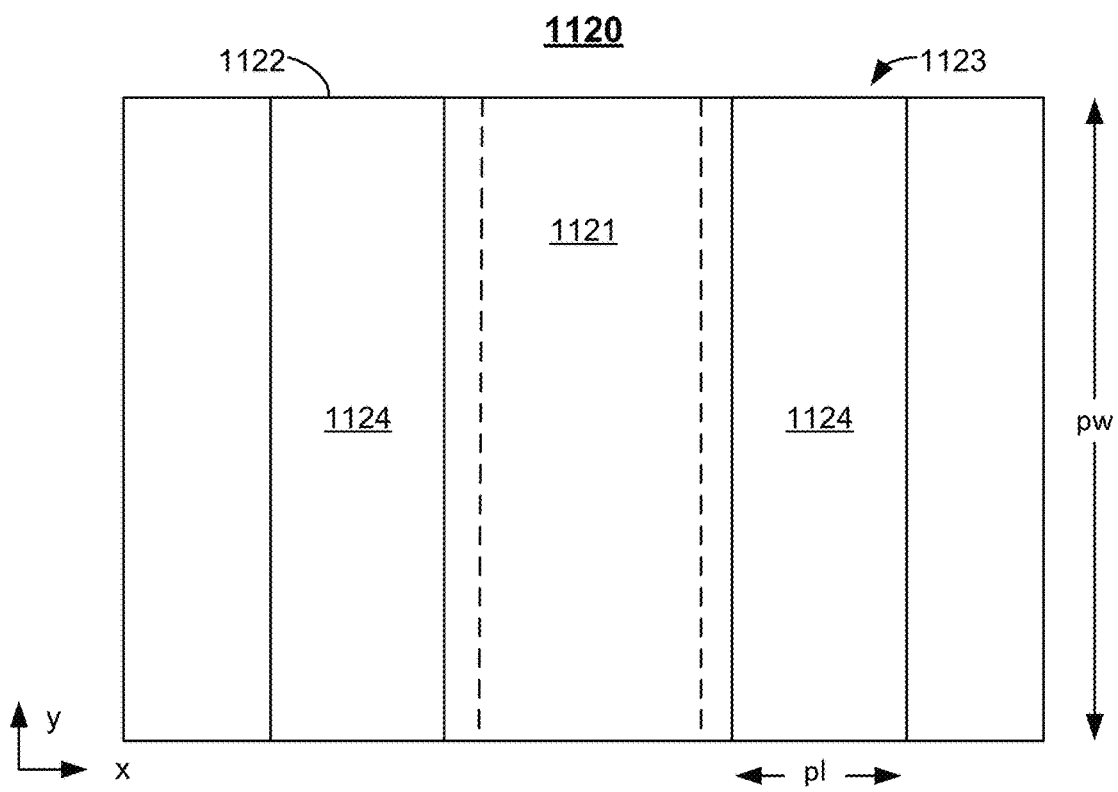
FIG. 11 depicts an embodiment of an engineered cooling element usable in an active MEMS cooling system.
Figure 12:
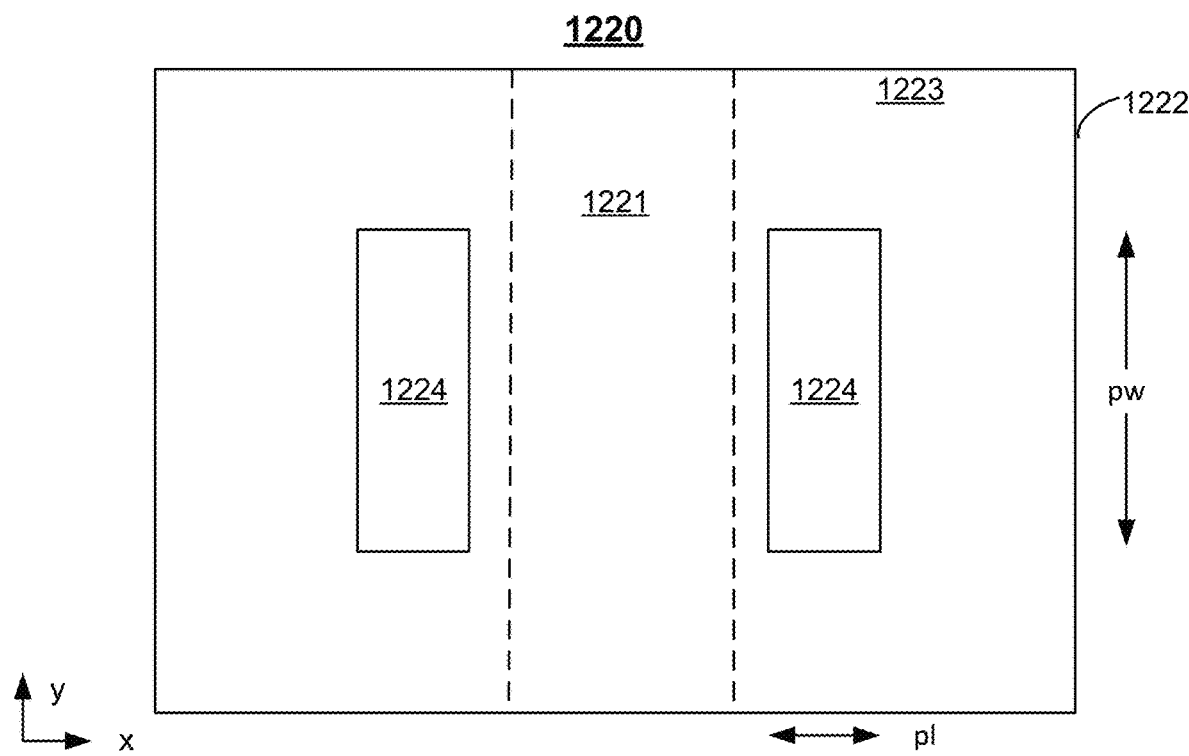
FIG. 12 depicts an embodiment of an engineered cooling element usable in an active MEMS cooling system.
Figure 13:
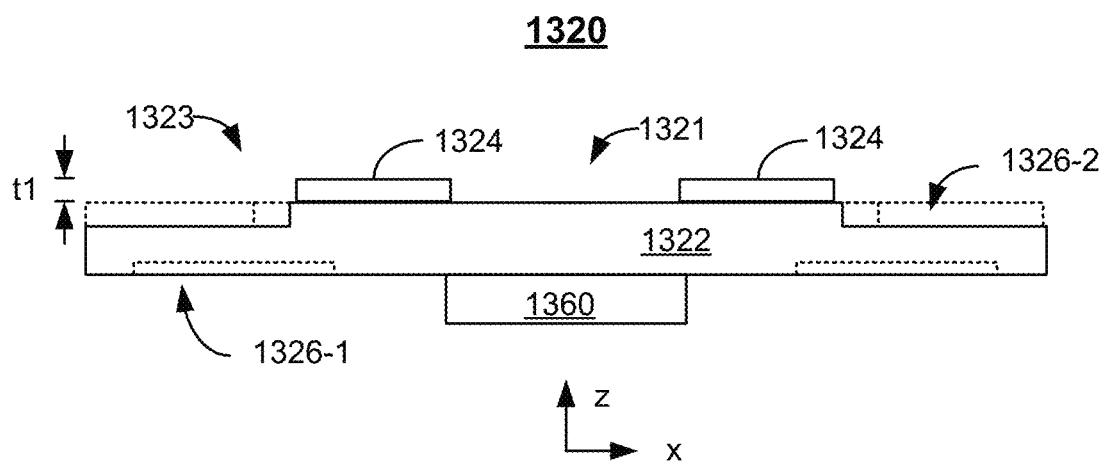
FIG. 13 depicts an embodiment of an engineered cooling element usable in an active MEMS cooling system.

FIGS. 11-13 depict embodiments of cooling elements 1120, 1220, and 1320, respectively, that are further engineered to improve performance. FIGS. 11-13 are not to scale and for clarity, only some structures are shown. Cooling elements 1120, 1220, and 1320 are analogous to cooling element 420 and thus may be used in cooling systems such as cooling systems 100, 200, 300, and/or 400. Cooling elements 1120, 1220, and 1320 each include anchored regions 1121, 1221, and 1321 and cantilevered arms 1123, 1223, and 1323 that are analogous to anchored region 421 and cantilevered arms 423, respectively. Cooling elements 1120, 1220, and 1320 are each centrally supported at anchored regions 1121, 1221, and 1321 such that at least a portion of the perimeter of cooling elements 1120, 1220, and 1320, respectively, is free to vibrate. In the embodiments depicted, anchors (not shown) and thus anchored regions 1121, 1221, and 1321 extend along the axis of cooling elements 1120, 1220, and 1320, respectively. In other embodiments, anchored regions 1121, 1221, and/or 1321 may be only near the center portion of cooling element 1120, 1220, and 1320, respectively. Cantilevered arms 1123, 1223, and 1323 of cooling elements 1120, 1220, and 1320 may be driven in-phase or driven out-of-phase.

Cooling elements 1120, 1220, and 1320 include piezoelectrics 1124, 1224, and 1324, respectively, which do not occupy the entire available area of cooling elements 1120, 1220, and 1320, respectively. Referring to FIG. 11, piezoelectrics 1124 extend to the edges of cooling element 1120 in the y-direction. In other words, the piezoelectric width, pw, is the same as the width of actuator 1122. However, piezoelectrics 1124 occupy only a portion of cantilevered arm 1123 in the x-direction. In some embodiments, the piezoelectric length is at least forty percent and not more than sixty percent (and in some embodiments fifty percent) of the length of cantilevered arm 1123. For example, piezoelectric 1124 may have a length that is nominally half of the length of cantilevered arm 1123. Thus, piezoelectric 1124 occupies nominally half of the available area of cantilevered arm 1123.

Referring to FIG. 12, piezoelectric 1224 has both a width and a length that are less than those of cantilevered arm 1223. In some embodiments, the piezoelectric length is at least forty percent and not more than sixty percent (and in some embodiments fifty percent) of the length of cantilevered arm 1223. Similarly, the piezoelectric length is at least forty percent and not more than sixty percent (and in some embodiments fifty percent) of the length of cantilevered arm 1223. For example, piezoelectric 1224 may have a length and a width that are nominally half of the length and width, respectively, of cantilevered arm 1223. The area occupied by piezoelectric 1224 in such an embodiment is nominally one-fourth of the available area. Referring to FIG. 13, piezoelectric 1324 has at least a length that is less than the length of cantilevered arm 1323. Thus, piezoelectrics 1124, 1224 and/or 1324 occupy not more than one-half of the surface area of cantilevered arms 1123, 1223, and/or 1323 (i.e. the portion of the actuator that is free to vibrate). In some embodiments, piezoelectrics 1124, 1224 and/or 1324 occupy not more than one-third of the surface area of cantilevered arms 1123, 1223, and/or 1323. In some embodiments, piezoelectrics 1124, 1224 and/or 1324 occupy not more than one-fourth of the surface area of cantilevered arms 1123, 1223, and/or 1323. In some embodiments, piezoelectrics 1124, 1224 and/or 1324 occupy at least one-fifth of the surface area of cantilevered arms 1123, 1223, and/or 1323. In some embodiments, piezoelectrics 1124, 1224 and/or 1324 occupy not more than one-eighth of the surface area of cantilevered arms 1123, 1223, and/or 1323. In some embodiments, piezoelectrics 1124, 1224 and/or 1324 occupy at least one-tenth of the surface area of cantilevered arms 1123, 1223, and/or 1323.

Thus, cooling elements 1120, 1220, and 1320 use piezoelectrics 1124, 1224, and 1324 that are smaller in area than the available area on cooling element 1120, 1220, and 1320 and/or thinner than that which may be typically used. The utility of such a configuration may be explained as follows. For cooling elements having piezoelectrics occupying more of the surface are (e.g. all of the surface area), a higher static deflection is achieved. This is because a larger volume of piezoelectric translates to a higher force and, therefore, a larger static deflection. However, there are larger losses (e.g. damping) due to the presence of the bigger volume of piezoelectric. Larger losses translate to higher power consumed and lower efficiency (low Q) for a given deflection. Further, a lower voltage but higher currents are used for larger volumes of piezoelectrics. Again, power consumed may be increased. For piezoelectrics 1124, 1224, and 1324 occupying less of the surface of actuator 1122, 1222, and 1322, respectively, the damping due to the piezoelectric is reduced. A higher deflection at or close to resonance may be achieved even though such actuators 1122, 1222, and 1322 exhibit a lower static deflection. Thus, using a smaller amount of piezoelectric may result in reduced power consumption (due to the reduced damping and improved Q) while maintaining the volumetric flow of fluid in the cooling system due to the vibration. Consequently, performance may be improved.

Further, piezoelectrics 1124, 1224, and 1324 have locations on cooling elements 1120, 1220, and 1320 selected such that strain may be mitigated. Thus, piezoelectrics 1124, 1224, and 1324 may be coupled to portions of actuators 1122, 1222, and 1322, respectively, that are free to move, but for which strain is reduced. Piezoelectrics 1124, 1224 and 1324 are located such that their edges are close to or at the end of anchored regions 1121, 1221, and 1321, respectively. Because of their lengths, piezoelectrics 1124, 1224, and 1324 may terminate less than one-half of the distance along cantilevered arms 1123, 1223, and 1323 from anchored region 1121, 1221, and 1321, respectively, to the tips of cooling elements 1120, 1220, and 1320. As previously indicated, cooling elements may be configured such that the bend in the normalized deflection profile shown in FIG. 5B occurs one-half to two-thirds of the distance from the anchored region to the tip. Thus, piezoelectrics 1124, 1224, and 1324 may be located closer to anchored regions 1121, 1221, and 1321, respectively, than the bend. Stated differently, piezoelectrics 1124, 1224, and 1324 may have positions in the lower deflection region. As such, piezoelectrics 1124, 1224, and 1324 may be less likely to exhibit strain-induced losses. Thus, the performance of the actuator may be further improved.

Similarly, cooling element 1320 utilizes piezoelectrics 1324 that have an engineered thickness, t1. The thickness of piezoelectric 1324 may be tailored. As piezoelectric 1324 is thinner in the z-direction, the losses may be decreased. However, for sufficiently thin bulk piezoelectrics, dielectric losses may increase. These dielectric losses may offset the increase in efficiency. In some embodiments, therefore, piezoelectrics 1324 have a thickness of at least fifty micrometers and not more than two hundred micrometers. In some such embodiments, piezoelectric 1324 has a thickness of at least seventy and not more than one hundred and fifty micrometers. In some such embodiments, piezoelectric 1324 has a thickness of at least one hundred and not more than one hundred and twenty-five micrometers.

Cooling elements 420, 620A, 620B, 720A, 720B, 820, 920, 1020, 1120, 1220, and/or 1320 are described in the context of various features. The features of cooling elements 420, 620A, 620B, 720A, 720B, 820, 920, 1020, 1120, 1220, and/or 1320 may be combined in various ways not explicitly depicted. For example, piezoelectrics having a lower thickness and area (e.g. for cooling 1120, 1220, and/or 1320) may be combined with top and bottom cavities (e.g. in cooling elements 1020 and/or 1320) and bottom cavities having ribs (e.g. in cooling element 820).

Figure 14:
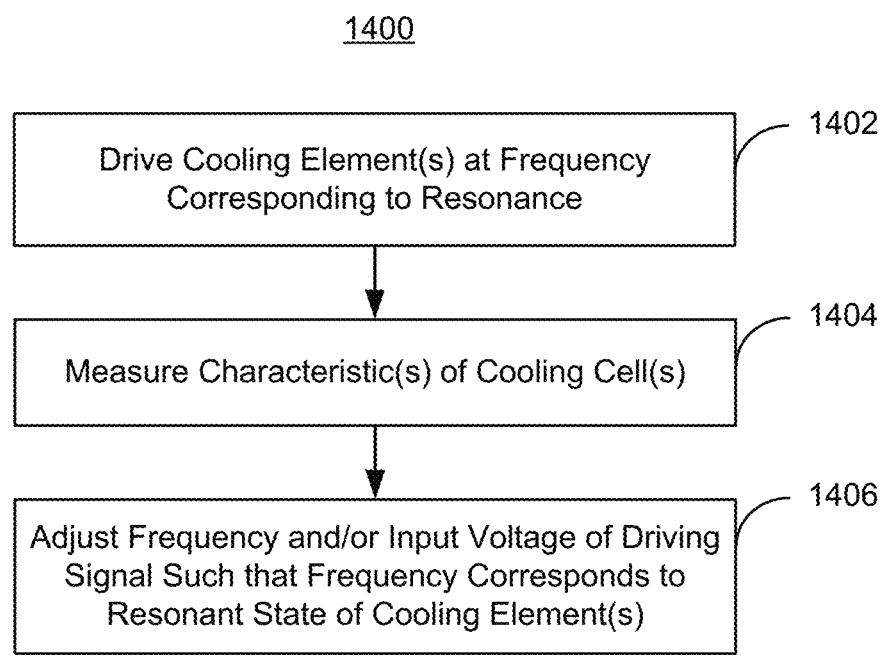
FIG. 14 depicts an embodiment of a method for using an active cooling MEMs system.

FIG. 14 depicts an embodiment of method 1400 for using an active cooling system. Method 1400 may include steps that are not depicted for simplicity. Method 1400 is described in the context of system 400. However, method 1400 may be used with other cooling systems including but not limited to systems and cells described herein.

A driving signal at a frequency and an input voltage corresponding to the resonant state of one or more cooling elements is provided to the active MEMS cooling system, at 1402. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above.

Characteristic(s) of the MEMS cooling system are monitored while the cooling element(s) are driven to provide a feedback signal corresponding to a proximity to a resonant state of the cooling element(s), at 1404. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 1404. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the cooling element, average voltage at the at least one cooling element, and/or the peak current drawn by the cooling element may be monitored. Using the characteristic(s) monitored, a deviation from the resonant state of the cooling element (e.g. of the driving/vibration frequency the deviation from the resonant frequency) may be determined.

The frequency and/or input voltage is adjusted based on the feedback signal, at 1406. More specifically, 1406 includes updating the frequency and/or input voltage, based on the feedback signal, to correspond to resonant state(s) of the cooling element(s) at 1406. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 1406 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling element 420 in MEMS cooling system 400 is driven, at 1402. Thus, the cooling element 420 is driven at a frequency that is at or near resonance for one or more of the cooling elements. Characteristics of cooling element 420 within MEMS cooling system 400 are monitored, at 1404. Thus, the drift of the cooling element(s) 420 from resonance may be determined. The frequency may be adjusted based on the monitoring of 1404, at 1406. Thus, MEMS cooling system 400 may be kept at or near resonance.

Thus, using method 1400, an active cooling system, such as cooling system(s) 100, 200, 300, and/or 400 using cooling elements 120, 120', 220, 320, 420, 620A, 620B, 720A, 720B, 820, 920, 1020, 1120, 1220 and/or 1320 may be efficiently driven. These cooling systems may also have improved volumetric flow displacement at lower stress on the cooling element and/or piezoelectric. Thus, such cooling system may have further improved efficiency and/or reliability. Thus, method 1400 may be used to operate active MEMS cooling systems and achieve the benefits described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
   a support structure; and
   a cooling element having a thickness and including an anchored region and a cantilevered arm, the anchored region being coupled to and supported by the support structure, the cantilevered arm extending outward from the anchored region wherein the cantilevered arm includes at least one cavity therein, the at least one cavity having a depth of at least one-third and not more than three-fourths of the thickness of the cooling element;
   wherein the cooling element is configured to undergo vibrational motion when actuated to drive a fluid for cooling a heat-generating structure.

2. The cooling system of claim 1, wherein the depth of the at least one cavity is at least one-half and not more than two-thirds of the thickness.

3. The cooling system of claim 1 wherein the cantilevered arm includes a tip distal from the anchored region and wherein the at least one cavity includes a first cavity on a bottom side of the cooling element and a second cavity on a top side of the cooling element, the first cavity being a distance from the tip and having a first depth, the second cavity having a second depth, the first depth plus the second depth being equal to the depth.

4. The cooling system of claim 3, wherein the second cavity further includes a recessed portion.

5. The cooling system of claim 1, wherein the at least one cavity of the cooling element further includes at least one of an additional tab, a cavity extension and a cross rib.

6. The cooling system of claim 1, wherein the cantilevered arm includes a tip distal from the anchored region, and wherein the at least one cavity is configured such that an anticlastic curvature across the tip is within thirty percent of a maximum normalized deflection.

7. The cooling system of claim 6, wherein the anticlastic curvature is within twenty percent of the maximum normalized deflection.

8. The cooling system of claim 1, wherein the cantilevered arm is configured such that at a maximum deflection, a bend in the cantilevered arm is present in a region that is at least one-half and not more than two-thirds along the cantilevered arm from the anchored region.

9. The cooling system of claim 1, further comprising:
a piezoelectric having a width, a length, and a piezoelectric thickness, the width being at least forty percent and not more than fifty percent of a cooling element width, the length being at least forty percent and not more than fifty percent of a cooling element length, the piezoelectric thickness being at least fifty micrometers and not more than two hundred micrometers.

10. The cooling system of claim 1, further comprising:
a top plate having at least one vent therein;
a bottom plate having a plurality of orifices therein, the bottom plate being disposed between the cooling element and the heat-generating structure; and
a plurality of cell walls, configured such that a top chamber is formed between the top plate and the cooling element and such that a bottom chamber is formed between the bottom plate, and the cooling element, the top chamber being in fluid communication with the bottom chamber.

11. A cooling system, comprising:
a plurality of cooling cells, each of the plurality of cooling cells including a cooling element having a thickness and including an anchored region and a cantilevered arm, the anchored region being coupled to and supported by a support structure, the cantilevered arm extending outward from the anchored region wherein the cantilevered arm includes at least one cavity therein, the at least one cavity having a depth of at least one-third and not more than three-fourths of the thickness of the cooling element, the cooling element undergoing vibrational motion when actuated to drive a fluid for cooling a heat-generating structure.

12. The cooling system of claim 11, wherein the depth of the at least one cavity is at least one-half and not more than two-thirds of the thickness.

13. The cooling system of claim 11 wherein the cantilevered arm includes a tip distal from the anchored region and wherein the at least one cavity includes a first cavity on a bottom side of the cooling element and a second cavity on a top side of the cooling element, the first cavity being a distance from the tip and having a first depth, the second cavity having a second depth, the first depth plus the second depth being equal to the depth.

14. The cooling system of claim 11, wherein the cantilevered arm includes a tip distal from the anchored region, and wherein the at least one cavity is configured such that an anticlastic curvature across the tip is within thirty percent of a maximum normalized deflection.

15. The cooling system of claim 11, wherein the cantilevered arm is configured such that at a maximum deflection, a bend in the cantilevered arm is present in a region that is at least one-half and not more than two-thirds along the cantilevered arm from the anchored region.

16. The cooling system of claim 11, further comprising:
a piezoelectric having a width, a length, and a piezoelectric thickness, the width being at least forty percent and not more than fifty percent of a cooling element width, the length being at least forty percent and not more than fifty percent of a cooling element length, the piezoelectric thickness being at least fifty micrometers and not more than two hundred micrometers.

17. A method of cooling a heat-generating structure, comprising:
driving a cooling element to induce a vibrational motion at a frequency, the cooling element having a thickness and including an anchored region and a cantilevered arm, the anchored region being coupled to and supported by a support structure, the cantilevered arm extending outward from the anchored region wherein the cantilevered arm includes at least one cavity therein, the at least one cavity having a depth of at least one-third and not more than three-fourths of the thickness of the cooling element, the cooling element being configured to undergo the vibrational motion when actuated to drive a fluid for cooling the heat-generating structure.

18. The method of claim 17 wherein the frequency corresponds to a resonant frequency for the cantilevered arm.

19. The method of claim 17, wherein the depth of the at least one cavity is at least one-half and not more than two-thirds of the thickness.

20. The method of claim 17 wherein the cantilevered arm includes a tip distal from the anchored region and wherein the at least one cavity includes a first cavity on a bottom side of the cooling element and a second cavity on a top side of the cooling element, the first cavity being a distance from the tip and having a first depth, the second cavity having a second depth, the first depth plus the second depth being equal to the depth.

* * * * *